United States Patent [19]

Yamamoto et al.

[11] Patent Number: 4,791,636
[45] Date of Patent: Dec. 13, 1988

[54] SEMICONDUCTOR LASER DEVICE AND A METHOD FOR DRIVING THE SAME

[75] Inventors: Saburo Yamamoto; Osamu Yamamoto; Taiji Morimoto, all of Nara; Hiroshi Hayashi, Soraku; Nobuyuki Miyauchi, Nara; Shigeki Maei, Nara, all of Japan

[73] Assignee: Sharp Kabushiki Kaisha, Osaka, Japan

[21] Appl. No.: 923,953

[22] Filed: Oct. 28, 1986

[30] Foreign Application Priority Data

Oct. 30, 1985 [JP] Japan ................ 60-245097
Nov. 29, 1985 [JP] Japan ................ 60-269598

[51] Int. Cl.$^4$ .............................................. H01S 3/19
[52] U.S. Cl. ........................................ 372/46; 372/44; 372/50
[58] Field of Search ................ 372/44, 46, 50, 43; 350/96.12

[56] References Cited

U.S. PATENT DOCUMENTS 3,828,231 8/1974 Yamamoto ................ 372/50

FOREIGN PATENT DOCUMENTS 0068391 6/1977 Japan ................ 372/50
8500472 1/1985 PCT Int'l Appl. .

Primary Examiner—William L. Sikes
Assistant Examiner—B. Randolph
Attorney, Agent, or Firm—Ciotti & Murashige, Irell & Manella

[57] ABSTRACT

A semiconductor laser device comprising a laser-oscillating optical waveguide composed of a control region which functions to absorb light and main regions which function to oscillate laser light, said control region being positioned in the center portion of said optical waveguide and said main regions being positioned on both ends of said control region, wherein said laser device further comprises a shunting means by which the ratio of the current Ig flowing to said control region to the total current It injected into said laser device is set to meet the inequality (1):

$$0.01 < \frac{Ig}{It} < \frac{1}{3} \frac{Lg}{Lt} \qquad (1)$$

wherein Lg is the length of said control region and Lt is the length of said optical waveguide.

7 Claims, 6 Drawing Sheets

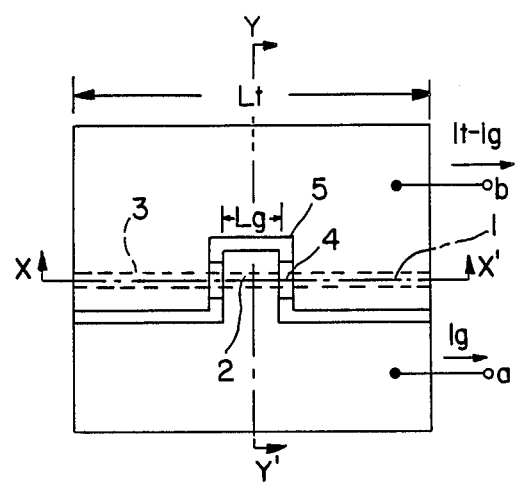
FIG. IA
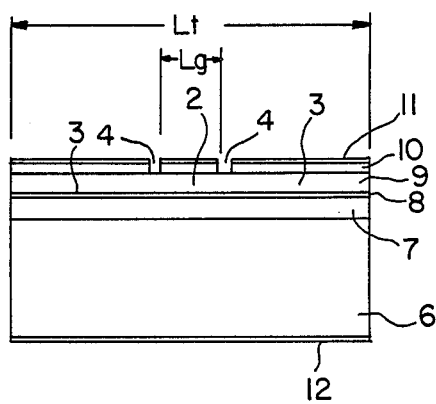
FIG. IB
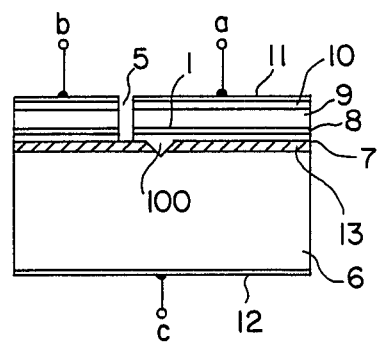
FIG. IC

SEMICONDUCTOR LASER DEVICE AND A METHOD FOR DRIVING THE SAME

BACKGROUND OF THE INVENTION

1. Field of the Invention

This invention relates to a semiconductor laser device achieving an incoherent length for use as a light source in video discs, analog optical communication, fiber-gyros, etc., and a method for driving the same.

2. Description of the Prior Art

In general, semiconductor laser devices which function not only to record signals on optical discs but also to read them are of a DRAW (direct read after write) type. These semiconductor laser devices are required to achieve as high an output power operation as possible so as to make recording of signals easy. For this purpose, the front facet for emitting light therefrom is coated with a low-reflection index film and the rear facet is coated with a high-reflection index film, so that a large amount of light can be emitted from the front facet, thereby achieving high output power operation. This approach is advantageous in that the differential efficiency from the front facet is improved and high output power can be produced by a small amount of driving current. However, the reflection index of the light-emitting facet of such a laser device is so low that light reflected by an optical disc returns to the laser device and attains an optical coupling with light produced within the laser device, resulting in an external resonator positioned between the front facet of the laser device and the optical disc face. The length of the external cavity varies to a great extent with movement of the optical disc face, which causes reflected light-induced noise, resulting in errors in reading the signals, which makes serious problems in practical use. In order to prevent the reflected light-induced noise, a method by which the coherent length of a semiconductor laser device is shortened enough so that the formation of an external resonator between the optical disc face and the laser device does not occur is known. According to this method, gain guided laser devices or index guided laser devices with a lowered refractive index are used so that laser oscillation in a multi-longitudinal mode. can be obtained or the width of each element of the multi-longitudinal mode can be enlarged by self-pulsation to thereby shorten the coherent length, causing the instability of the transverse mode, which makes high output power operation difficult.

SUMMARY OF THE INVENTION

The semiconductor laser device of this invention, which overcomes the above-discussed and numerous other disadvantages and deficiencies of the prior art, comprises a laser-oscillating optical waveguide composed of a control region which functions to absorb light and main regions which function to oscillate laser light, said control region being positioned in the center portion of said optical waveguide and said main regions being positioned on both ends of said control region, wherein said laser device further comprises a shunting means by which the ratio of the current Ig flowing to said control region to the total current It injected into said laser device is set to meet the inequality (1):

$$0.01 < \frac{Ig}{It} < \frac{1}{3}\frac{Lg}{Lt} \quad (1)$$

wherein Lg is the length of said control region and Lt is the length of said optical waveguide.

In a preferred embodiment, the control region is separated from said main regions by shallow grooves located above said optical waveguide, said shallow grooves being connected to deep grooves located in parallel to said optical waveguide at a certain distance from said optical waveguide in a zigzag manner with regard to the main region, the control region, and the other main region.

In a preferred embodiment, the shunting means is an external shunt resistor or a built-in shunt resistor.

The method for driving semiconductor laser devices of this invention, which also overcomes the above-discussed and numerous other disadvantages and deficiencies of the prior art, comprises controlling the amount of current injected into each of said control region and said main regions by a shunting means in such a manner that when said laser devices achieve low output power operation, said current flowing to said control region is maintained at a low level whereby said control region becomes a saturable absorption region, and when said laser devices achieve high output power operation, said current flowing to said control region is maintained at a high level.

In a preferred embodiment, the control region is separated from said main regions by shallow grooves located above said optical waveguide, said shallow grooves being connected to deep grooves located in parallel to said optical waveguide at a certain distance from said optical waveguide in a zigzag manner with regard to the main region, the control region, and the other main region.

In a preferred embodiment, the shunting means is composed of external shunt resistors, one of which is selected by a switching means to accommodate therethrough the current to said control region.

Thus, the invention described herein makes possible the objects of (1) providing an incoherent semiconductor laser device which can be reproduced by the control of current flowing to a saturable absorption region, which is formed in a portion of the optical waveguide, by means of a shunting means; (2) providing an incoherent semiconductor laser device in which noise derived from reflected light does not occur, so than when the laser device is used as a light source in video discs, analog optical communication, fiber-gyros, etc., stable images and/or signals can be obtained; (3) providing a method for driving the semiconductor laser device by which the laser device is driven with a stable transverse mode even at a high output power operation and with a shortened coherent length at a low output power operation, and moreover it is driven without the occurence of noise due to reflected light, so that the laser device can be useful as an information processing light source.

BRIEF DESCRIPTION OF THE DRAWINGS

This invention may be better understood and its numerous objects and advantages will become apparent to those skilled in the art by reference to the accompanying drawings as follows:

FIG. 1(A) is a plane view showing a three-terminal type incoherent semiconductor laser device of this invention.

FIG. 1(B) is a sectional view of the semiconductor laser device taken along the line X—X' shown in FIG. 1(A).

FIG. 1(C) is a sectional view of the semiconductor laser device taken along the line Y—Y' shown in FIG. 1(A).

DESCRIPTION OF THE PREFERRED EMBODIMENTS

Example 1

Figure 2:
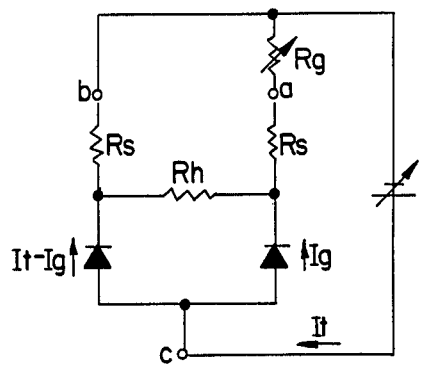
FIG. 2 shows an equivalent network of the semiconductor laser device shown in FIGS. 1(A) to 1(C).

FIGS. 1(A) to 1(C) show a semiconductor laser device of this invention, which comprises an optical waveguide 1 with the internal cavity length Lt which functions as the laser oscillation-operating area. The optical waveguide 1 is composed of a control region (or a saturable absorption region) 2 with the length Lg positioned in the center portion and two main regions 3 positioned on both ends of the control region 2. The control region 2 is separated from each of the two main regions 3 by shallow grooves 4 which are formed above the optical waveguide 1. The semiconductor laser device is also provided with deep grooves 5 which are located in parallel to the optical waveguide 1 at a certain distance from the optical waveguide 1 in a manner to connect to the grooves 4. This semiconductor laser device further comprises a p-semiconductor substrate 6, an n-current blocking layer 13, a p-cladding layer 7 for confining carriers therein, a p- (or n- or non-doped) active layer 8 for laser oscillation, an n-cladding layer 9 for confining carriers therein, and an n-cap layer 10 for achieving an ohmic contact in that order, resulting in a double-heterostructure multi-layered crystal. An n-sided electrode 11 and a p-sided electrode 12 are disposed on the upper face of the cap layer 10 and the back face of the semiconductor substrate 6, respectively, and are connected to an external circuit. Moreover, a V-channeled stripe 100 is formed in the semiconductor substrate 6 through the n-current blocking layer 13 so as to open a current path, resulting in a VSIS (V-channeled substrate inner stripe) semiconductor laser device.

The optical waveguide 1, which functions as a laser oscillation-operating area and both ends of which form the facets for emitting laser light therefrom, exists within the portion of the active layer positioned above the V-channel 100. The grooves 4 are positioned above the optical waveguide 1 as shown in FIG. 1(B) and composed of two shallow grooved portions which reach the interface between the cap layer 10 and the n-cladding layer 9 via the n-sided electrode 11 and the cap layer 10. The grooves 5 are positioned outside of the optical waveguide 1 as shown in FIG. 1(C) and composed of three deep grooved portions which reach the interface between the p-cladding layer 7 and the current blocking layer 13 via the n-sided electrode 11, the n-cladding layer 9, the active layer 8 and the p-cladding layer 7. Two of the three grooved portions of the grooves 5 located between the facets and the grooves 4 and the other grooved portion located between the grooves 4 are disposed in a zigzag manner with regard to the optical waveguide 1. Thus, the control region 2 is electrically connected to each of the two main regions 3 by the portions of the active layer 8 and the portions of the n-cladding layer 9 positioned below the grooves 4. The active layer 8 is separated from the n-cladding layer 9 by the grooves 5. It is preferable that the coupling resistance in the connection portion at which the control region 2 is connected to the main regions 3 is high.

FIG. 2 shows an equivalent network of the semiconductor laser device shown in FIGS. 1(A) to 1(C), wherein Rs corresponds to the contact resistance between the electrodes 11 and 12 and the laser device (i.e., the series resistance of the laser device), Rh corresponds to the above-mentioned coupling resistance, a and b correspond to the electrode terminals of the control region 2 and the main region 3, respectively, and c corresponds to the common terminal disposed on the substrate 6. This semiconductor laser device is mounted on a three-terminal type stem. By connecting a shunt resistor Rg to the terminal a, the total current It injected into this laser device can be branched into Ig and It-Ig, which flow into the control region 2 and the main region 3, respectively. If the shunt resistor Rg is put into the stem, a two-terminal stem can be used as the stem on which the laser device is mounted. By changing the resistance of the resistor Rg so as to change the current ratio Ig/It, the inventors determined the oscillation longitudinal mode of the laser device and found the fact that when Ig/It and Lg/Lt meet the inequality (1), self-pulsation occurs and the spectral width of the longitudinal mode is enlarged up to 0.2 Å–2 Å, which will come to as short as 3 cm–0.3 cm in the coherent length.

$$0.01 < \frac{Ig}{It} < \frac{3}{2} \frac{Lg}{Lt} \quad (1)$$

Although the oscillation threshold current Ith must be at the minimum value when $Ig/It = Lg/Lt$, it will increase by only 5-15 mA according to the inequality (1). Such an increase in the oscillation threshold current has no effect on the shortening of the coherent length. When $Ig/It < 0.01$, the control region 2 becomes a complete absorption region so that the laser device cannot attain laser oscillation.

Figure 5:
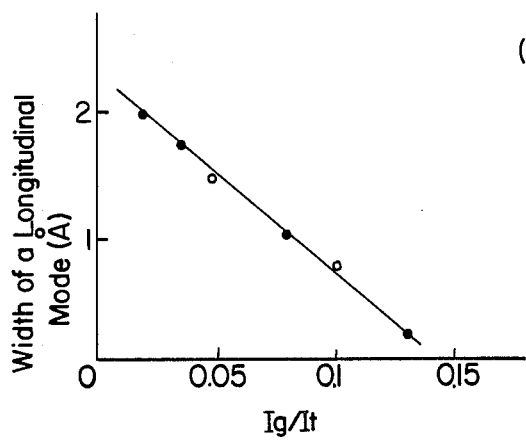
FIG. 5 is a graph showing the dependence of the width of a longitudinal mode on the current ratio Ig/It with regard to the semiconductor laser device shown in FIGS. 1(A) to 1(C).

FIG. 5 is a characteristic curve showing the relationship between the current ratio Ig/It and the width of a longitudinal mode at an optical output power of 3 mW. The ratio Ig/It varies with changes in the resistance of the external resistor Rg. The longitudinal mode width continuously varies from 2 to 0.2 Å in the Ig/It range of 0.02 to 0.13. The oscillation wavelength λ of this laser device was 780 nm, the coupling resistance Rh of this laser device was 500Ω, and the contact resistance Rs between the electrodes and this laser device was 5Ω.

Figure 6:
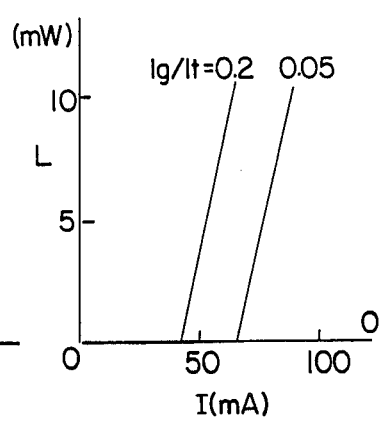
FIG. 6 is a graph showing the relationship between the current I and the optical output L with regard to the semiconductor laser device shown in FIGS. 1(A) to 1(C).

FIG. 6 is a characteristic curve showing the relationship between the current I and the optical output power L at the Ig/It values of 0, 0.05, and 0.2, which indicates that the dual stable state does not occur when $Ig/It > 0.01$.

In the above-mentioned example, a p-GaAs substrate was used as the semiconductor substrate 6, an n-GaAs was used as the current blocking layer 13, a p-$Ga_{0.5}Al_{0.5}As$ was used as the p-cladding layer 7, a $Ga_{0.85}Al_{0.15}As$ was used as the active layer 8, an n-$Ga_{0.5}Al_{0.5}As$ was used as the cladding layer 9, an n-GaAs was used as the cap layer 10, and an Au—Ge/Al and an Au—Zn, respectively, were used as the n-sided electrode 11 and the p-sided electrode 12. The internal cavity length Lt was 250 μm and the length Lg of the center portion (i.e., the control region 2) of the optical waveguide 1 was 50 μm. In order to meet the inequality (1), Ig/It was set to be greater than 0.01 but to be less than 0.13 (i.e., $0.01 < Ig/It < 0.13$).

Example 2

Figure 4:
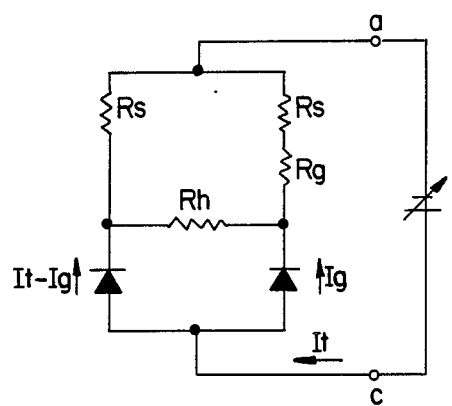
FIG. 4 shows an equivalent network of the semiconductor laser device shown in FIGS. 3(A) to 3(C).
Figure 3A:
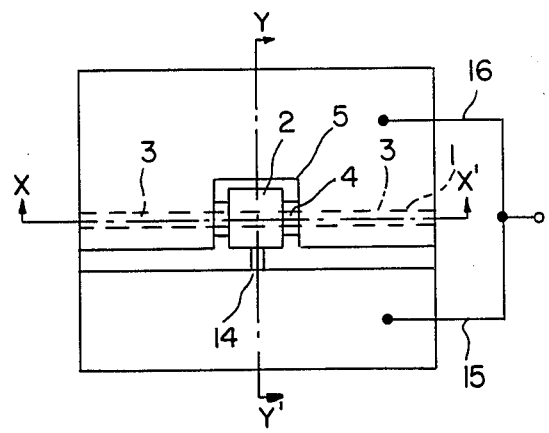
FIGS. 3(A) to 3(C), respectively, are a plane view showing a two-terminal type incoherent semiconductor laser device of this invention, a sectional view of the semiconductor laser device in line X—X' shown in FIG. 3(A), and a sectional view of the semiconductor laser device in line Y—Y' shown in FIG. 3(A).
Figure 3B:
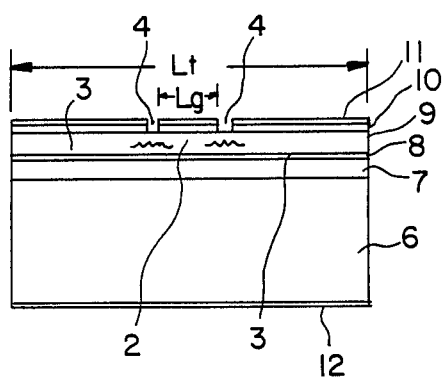
Figure 3C:
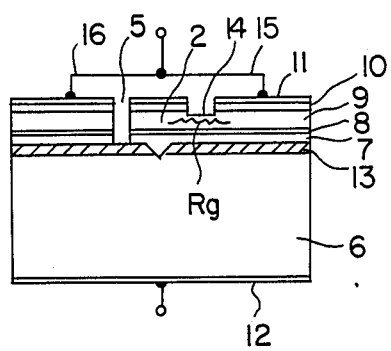

FIGS. 3(A), 3(B) and 3(C) show another semiconductor laser device of this invention. FIG. 4 shows an equivalent network of the semiconductor laser device shown in FIGS. 3(A) to 3(C), which is the same as described in Example 1 except that the resistor Rg is composed of a built-in resistance bridge 14 disposed within the laser device. Current is fed to the control region 2 through the narrow and long resistance bridge 14 which is positioned on the n-cladding layer 9. The resistance bridge 14 is constituted by a groove which has the same depth as the grooves 4 and which reaches the interface between the cap layer 10 and the n-cladding layer 9. The resistance of the resistance bridge 14 (i.e., the resistance of the resistor Rg) can be selected to be a desired value by the control of the width and length of the resistance bridge 14 and/or the thickness of the n-cladding layer 9. In order to obtain the current ratio represented by the inequality (1), the resistor Rg is selected to meet the inequality (2).

$$100 Rs > Rg > \frac{3}{2} \frac{Lt}{Lg} \times Rs \quad (2)$$

As a stem on which this semiconductor laser device is mounted, an ordinary two-terminal type stem can be employed if wires 15 and 16 through which current is fed to the control region 2 and the main regions 3 are bonded to a common terminal of the stem.

Figure 7A:
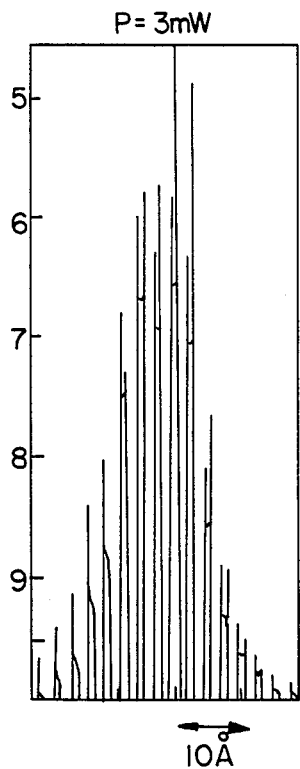
FIG. 7(A) is a graph showing the oscillation spectra in a multi-longitudinal mode of the semiconductor laser device shown in FIGS. 3(A) to 3(C).
Figure 7B:
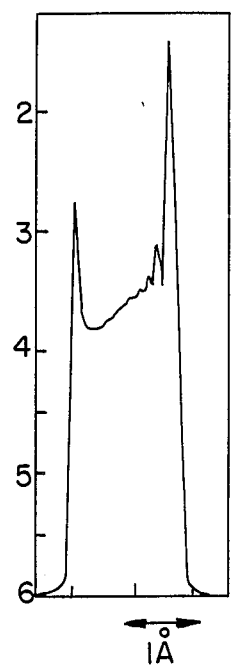
FIG. 7(B) is an enlarged graph showing the oscillation spectrum of a single element of the multi-longitudinal mode of the semiconductor laser device shown in FIGS. 3(A) to 3(C).

When the width of the resistance bridge 14 and the length thereof were 7 μm and 10 μm, respectively, and the thickness of the n-cladding layer 9 was 2 μm, the resistance Rg was 150Ω. The oscillation threshold current of the semiconductor laser device was 65 mA and a multi-mode oscillation with an enlarged longitudinal mode width of 2 Å was attained at an optical output power of 3 mW. The oscillation spectra are shown in FIG. 7(A) and the enlarged oscillation spectrum of a single element of the multi-longitudinal mode is shown in FIG. 7(B).

In the above-example, materials used for the substrate 6, the current blocking layer 13, the p-cladding layer 7, the active layer 8, the n-cladding layer 9, the cap layer 10, and the n- and p- sided electrodes 11 and 12 were same as those of Example 1. The lengths Lt and Lg were 250 μm and 50 μm, respectively. Ig/It were set to be $0.01 < Ig/It < 0.13$ to meet the inequality (1).

Although Examples 1 and 2 disclosed a GaAs-GaAlAs semiconductor laser device alone, they can be applied to semiconductor laser devices of InGaAsP systems and other semiconductor materials. The optical waveguide structure is not limited to a VSIS type, but any kind of optical waveguide structure can be used in this invention. Moreover, the position, the length, etc., of the control region are not limited to the conditions described in Examples 1 and 2.

Example 3

Figure 8A:
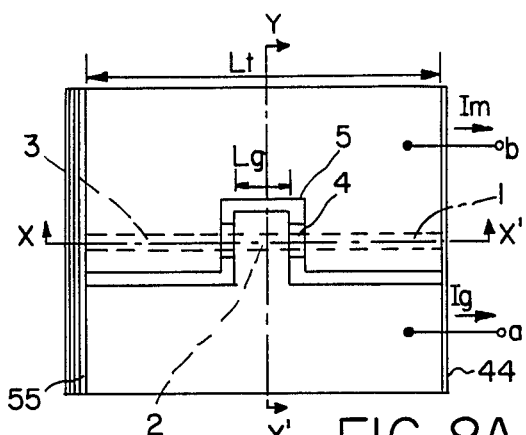
FIGS. 8(A), 8(B) and 8(C), respectively, are a plane view showing another semiconductor laser device of this invention, a sectional view of the semiconductor laser device in line X—X' shown in FIG. 8(A), and a sectional view of the semiconductor laser device in line Y—Y' shown in FIG. 8(A).
Figures 8B, 8C:
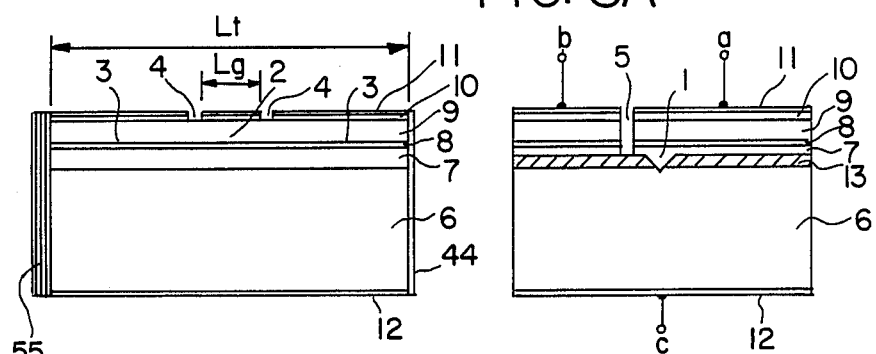

This example discloses a method for driving semiconductor laser devices according to this invention, wherein the semiconductor laser device shown in FIGS. 8(A), 8(B) and 8(C) was used. This semiconductor laser device is the same as that shown in FIGS. 1(A) to 1(C) except that the front facet for emitting light therefrom was covered with a dielectric film 44 of $Al_2O_3 \cdot Si_3N_4$ or the like which has a thickness of about λ/4 (λ is the oscillation wavelength) and which has a reflection index of 2-8%, and that the rear facet was covered with a dielectric film 55 composed of alternate layers which consist of low-refractive index films of $Al_2O_3 \cdot Si_3N_4$ or the like (the thickness of each film being about λ/4) and high-refractive index films of Si or the like (the thickness of each film being about λ/4). The reflective index of the dielectric film 55 is in the range of 70 to 95%.

Figure 9:
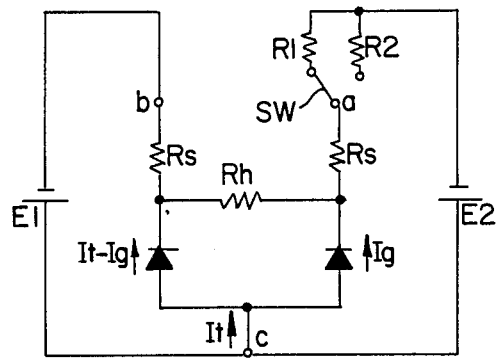
FIG. 9 shows an equivalent network of the semiconductor laser device shown in FIGS. 8(A) to 8(C).

FIG. 9 shows an equivalent network and an operation circuit of the semiconductor laser device shown in FIGS. 8(A) to 8(C), wherein Rs, Rh, a, b, and c are the same as those shown in FIG. 2 of Example 1. This laser device is mounted on a three-terminal type stem. $R_1$ and $R_2$ are the resistances for controlling a current which flows to the control region 2, and $R_1$ is set to be smaller than $R_2$ (i.e., $R_1 < R_2$). $R_1$ and $R_2$ are shunt resistors connected to the terminal a by a switch Sw such that the total current It can be branched into Ig and $Im(=It-Ig)$ which flow to the control region 2 and the main region 3, respectively. $R_1$ can be, of course, composed of a variable shunt resistor Rg for obtaining an incoherent length described in Example 1. In this case, $R_2$ is omitted.

Figure 10:
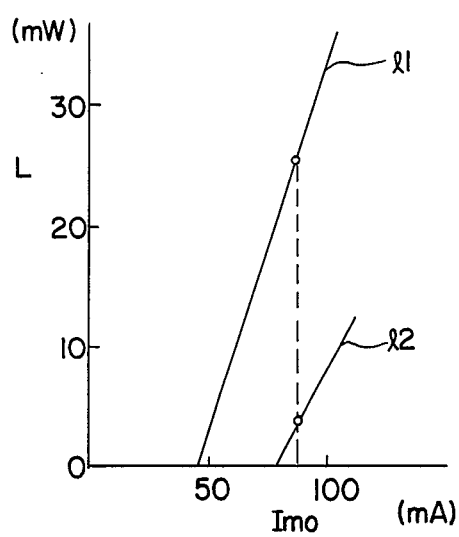
FIG. 10 is a graph showing the relationship between the current Im and the optical output L with regard to the semiconductor laser device shown in FIGS. 8(A) to 8(C).
Figure 11A:
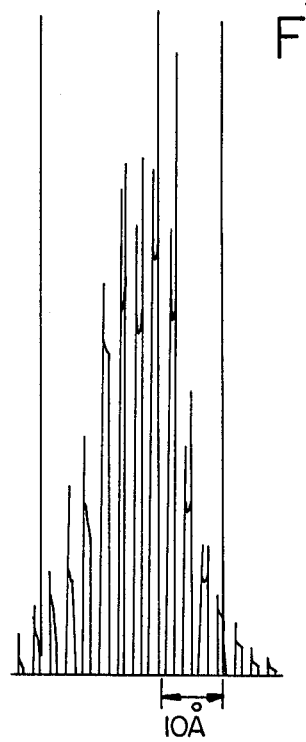
FIGS. 11(A) and 11(B), respectively, are graphs showing the oscillation spectra in reading signals and in writing signals of the semiconductor laser device shown in FIGS. 8(A) to 8(C).
Figure 11B:
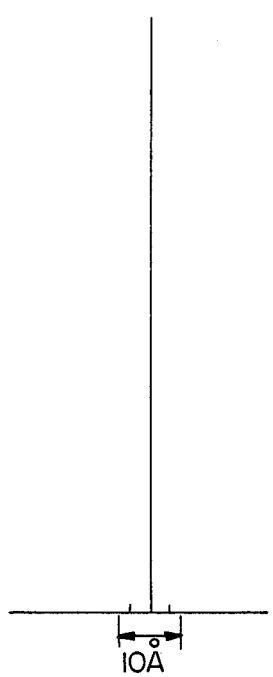

FIG. 10 shows a characteristic curve showing the relationship between the current Im and the optical output power L, wherein the curve $l_1$ is the I-L characteristics attained when a large amount of Ig flowed into the control region 2 via $R_1$ by means of the switch Sw and the curve $l_2$ is the I-L characteristics attained when a small amount of Ig flowed to the control region 2 via $R_2$ by means of the switch Sw. When the amount of Ig is small, the control region 2 becomes a light absorption region, which causes an increase in the threshold current Ith, resulting in self-pulsation within the laser device. Thus, the oscillation longitudinal mode attained by the laser device is a multi-mode, the width of each element of which is broad, 0.1–2 Å. This phenomenon is shown in FIG. 11(A) illustrating the oscillation spectra in reading signals. In this case, since the coherent length of the semiconductor laser device becomes as short as 3 mm–90 mm, even when the semiconductor laser device is used as a means for reading signals of an optical disc, an external resonator is not formed between the semiconductor laser device and the optical disc, and accordingly noise due to reflected light from the optical disc never occurs. On the other hand, when the recording of signals at which a high output power operation is required is carried out, noise due to reflected light almost never occurs. FIG. 11(B) shows the oscillation spectra in recording signals.

This semiconductor laser device is operated as follows: The current Im flowing to the main regions 3 is maintained at a fixed level (Imo) and the current Ig is injected into the control region 2 via one of the shunt resistors $R_1$ and $R_2$, the selection of which can be readily conducted by means of the switch Sw, so that the operation conditions that are suitable to the recording and reading of signals can be easily set up.

It is not necessarily essential to the operation of the laser device that the current Im is maintained at a fixed level. As described in Example 1, the inventors tried to determine the oscillation longitudinal mode of this semiconductor laser device by changing the value of the shunt resistor so as to change the current ratio Ig/It, and observed that when Ig/It and Lg/Lt meet the inequality (1), self-pulsation occurs and the spectral width is enlarged to 0.1 Å–2 Å, which will result in a coherent length of as short as 3 mm–90 mm. Although the oscillation threshold current Ith must be at the minimum value when $Ig/It=1$, it will become only about 5–15 mA according to the inequality (1). Such an increase in the oscillation threshold current has no effect on the shortening of the coherent length. When Ig/It<0.01, the control region 2 becomes a complete absorption region so that the laser device cannot attain laser oscillation.

Although the above-mentioned example disclosed a GaAs-GaAlAs semiconductor laser device alone, InGaAsP/InP systems can also be used. Moreover, the structure of the optical waveguide is not limited to a VSIS type, but any kind of optical waveguide structure can be used in this invention. The position, the length, etc., of the control region are not limited to the conditions described in Example 3.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a laser-oscillating optical waveguide, said waveguide is composed of a control region which functions to absorb light and main regions which function to oscillate laser light, said control region being positioned in the center portion of said optical waveguide and said main regions being positioned on both ends of said control region, and said laser device further comprises a shunting means by which the ratio of the current Ig flowing to said control region to the total current It injected into said laser device is set to meet the inequality (1):

$$0.01 < Ig/It < 2/3 \cdot Lg/L \qquad (1)$$

wherein Lg is the length of said control region and Lt is the length of said optical waveguide.

2. A semiconductor laser device according to claim 1, wherein said control region is separated from said main regions by shallow grooves located above said optical waveguide, said shallow grooves being connected to deep grooves located in parallel to said optical waveguide at a certain distance from said optical waveguide in a zigzag manner with regard to one of said main regions, the control region, and the other of said main regions.

3. A semiconductor laser device according to claim 1, wherein said shunting means is an external shunt resistor.

4. In a semiconductor laser device comprising a laser-oscillating optical waveguide composed of a control region which functions to absorb light and main regions which function to oscillate laser, said control region being positioned in the center portion of said optical waveguide and said main regions being positioned on both ends of said control region, and said laser device further comprises a shunting means by which
   the amount of current injected into each of said control region and said main regions is controlled in such a manner that when said laser devices achieve low output power operation, said current flowing to said control region is maintained at a low level whereby said control region becomes a saturable absorption region, and when said laser devices achieve high output power operation, said current flowing to said control region is maintained at a high level.

5. A semiconductor laser device according to claim 4, wherein said control region is separated from said main regions by shallow grooves located above said optical waveguide, said shallow grooves being connected to deep grooves located in parallel to said optical waveguide at a certain distance from said optical waveguide in a zigzag manner with regard to one of said main regions, the control region, and the other of said main regions.

6. A method for driving semiconductor laser devices according to claim 4, wherein said shunting means is composed of external shunt resistors, one of which is selected by a switching means to accommodate therethrough the current to said control region.

7. A semiconductor laser device according to claim 1, wherein said shunting means is a built-in shunt resistor.

* * * * *